United States Patent [19]

Tanaka

[11] Patent Number: 4,656,385

[45] Date of Patent: Apr. 7, 1987

[54] HOUSING HAVING GROOVES THEREIN FOR MOUNTING A PIEZOELECTRIC LADDER FILTER

[75] Inventor: Yasuhiro Tanaka, Ishikawa, Japan

[73] Assignee: Murata Manufacturing Co., Ltd., Nagaokakyo, Japan

[21] Appl. No.: 724,631

[22] Filed: Apr. 16, 1985

[30] Foreign Application Priority Data

Apr. 17, 1984 [JP] Japan .................................. 59-57120

[51] Int. Cl.$^4$ .............................................. H03H 9/10
[52] U.S. Cl. .................................... 310/348; 333/189; 174/52 R
[58] Field of Search ............... 333/187, 189, 190, 192, 333/186, 185; 174/52 R; 310/342, 334, 324, 322, 344, 345, 346, 347, 352, 355, 348, 340

[56] References Cited

U.S. PATENT DOCUMENTS

| 2,293,485 | 8/1942 | Baldwin | 310/342 X |
| 2,927,285 | 3/1960 | Curran et al. | 310/342 X |
| 4,323,865 | 4/1982 | Tanaka et al. | 333/187 |

FOREIGN PATENT DOCUMENTS 0149750  12/1978  Japan .................................. 333/189

Primary Examiner—Eugene R. LaRoche
Assistant Examiner—Benny Lee
Attorney, Agent, or Firm—Wenderoth, Lind & Ponack

[57] ABSTRACT

A filter of the ladder type has an elongated hollow casing with an aperture at one axial end face and at least two grooves on the inner surface at at least two different positions around the inner periphery thereof and which extend parallel to the longitudinal axis of the body. An elongated terminal strip in the bottom of one of the grooves extends along substantially the entire length of the one groove and extends out of the casing. A plurality of piezoelectric devices and a plurality of terminal plates stacked in the casing in the direction of the longitudinal axis and in an order for forming a ladder type filter. Some of the terminal plates have terminal tips extending into the one groove in firm electrical contact with the terminal strip. The terminal tips on some of the remainder the terminal plates extend into another groove and the terminal tips some of these have longitudinally extending terminal portions extending along the groove and with which the terminal tips on some of the remainder of the terminal plates are in electric contact for forming the ladder type filter. Terminal tips on the two end terminal plates extend out of the casing.

3 Claims, 9 Drawing Figures

HOUSING HAVING GROOVES THEREIN FOR MOUNTING A PIEZOELECTRIC LADDER FILTER

FIELD OF THE INVENTION

The present invention is related to an electrical filter of the ladder type wherein a plurality of piezoelectric devices are housed in a casing together with other elements such as terminal plates.

BACKGROUND OF THE INVENTION

The conventional filter of the ladder type has a box-like casing 1 made of an insulating material as shown in FIG. 7. One side face of the casing 1 is opened to form an aperture 1a through which elements and devices are put into the casing 1.

As is shown in FIG. 8, a predetermined number of piezoelectric devices 2, a plurality of terminal plates 3 and, if necessary, insulating plates 4 are put into the casing 1 in a predetermined order to form a filter circuit of the ladder type, an equivalent circuit thereof being shown in FIG. 5.

In order to complete the circuit of FIG. 5, as is shown in FIG. 8, a pair of terminal plates 3 inserted between the first and second piezoelectric devices 2 is electrically connected to the terminal plate 3 by a common tip end 5a, which is electrically connected to one electrode of the third piezoelectric device 2. Also, a pair of terminal plates 3 inserted between the third and fourth piezoelectric devices is electrically connected to the terminal plate 3 with a common tip end 5a, which is electrically connected to one electrode of the fifth piezoelectric device 2. Each terminal plate 3 inserted between an end wall 1e of the casing 1 and the first or the fifth piezoelectric device has a terminal tip end 5b passing through the end wall 1e of the casing to form input or output terminals of the filter.

Each terminal plate insulated by the insulating plate 4 relative to the terminal plate having the terminal tip end 5a is electrically connected to an elongated terminal tip 5c by tip end 5d. Each end portion of the terminal tip 5c extends through the end wall 1e of the casing. After the ladder circuit having four terminals is completed in the casing 1, the aperture 1a of the casing 1 is hermetically sealed with a cover plate 6.

In the conventional filter described, each of terminal tips 5a, 5b and 5d is usually internally formed respectively with the corresponding terminal plate 3. Further, there is formed a projection 3a at the center of the terminal plate 3 for contacting the piezoelectric device electrically and resiliently to hold the same between two terminal plates.

The structures of the conventional filter of the ladder type have disadvantages in that it is difficult to assemble a filter automatically by the use of an automatic assembly machine and therefore the filter of this type is not suitable for mass production for the following reasons;

electrodes of the piezoelectric device can be destroyed when projections of the terminal plate are rubbed thereon while putting elements 3 and 4 and devices 2 into the casing of the filter, and terminal tips 5d must be electrically connected to the terminal tip 5c with solder.

SUMMARY OF THE INVENTION

One object of the present invention is to provide an electrical filter of the ladder type having a structure according to which piezoelectric devices, terminal plates and, if necessary, insulating plates can be easily put into the casing thereof and a ladder filter circuit can be completed without any electrical connection with the use of solder.

According to the present invention, there is provided an electrical filter of the ladder type comprising:

a casing in the shape of an elongated hollow body which has an aperture opening out of one end face in the axial direction and at least one groove formed on the inner side wall thereof which extends in a direction parallel to the axis of the casing, a plurality of piezoelectric devices and a plurality of terminal plates which are put into the casing through said aperture in a predetermined order, at least one elongated terminal tip inserted into the groove in the casing at least one end of which extends out of the casing, terminal tips being formed respectively in one piece with predetermined terminal plates, said terminal tips being selectively contacted in such a manner that a filter circuit of the ladder type is completed, and a seal means for sealing up the aperture hermetically.

According to one aspect of the present invention, every electrical contact is provided in the groove of the casing and, therefore, every contact between two terminal tip ends is maintained tight therein.

According to another aspect of the present invention, the groove is defined by two ribs formed parallel in the axial direction of the casing. These ribs act as a guide means when putting elements or devices into the casing and, after insertion, act as support means which support the piezoelectric devices, thus maintaining a small distance between the inner walls of the casing and the elements which allows vibrations of the devices.

Other objects and advantages of the present invention will become apparent from the following description of embodiments with reference to the accompanying drawings in which;

FIG. 1 shows terminal plates and terminal tips according to a preferred embodiment of the present invention, FIG. 2 is a perspective view of the casing according to the embodiment of the present invention, FIG. 3 is a perspective view of the filter of the ladder type according to the embodiment, FIGS. 4(A) and 4(B) are sectional views along lines A—A' and B—B' of FIG. 3 respectively, FIG. 5 is an equivalent circuit diagram of a filter of the ladder type, FIG. 6 is a partial side view showing modifications of the present invention, FIG. 7 is a perspective view showing a casing of a conventional filter of the ladder type, and FIG. 8 is a sectional view showing the conventional filter of the ladder type.

DESCRIPTION OF THE PREFERRED EMBODIMENTS

Figure 1:
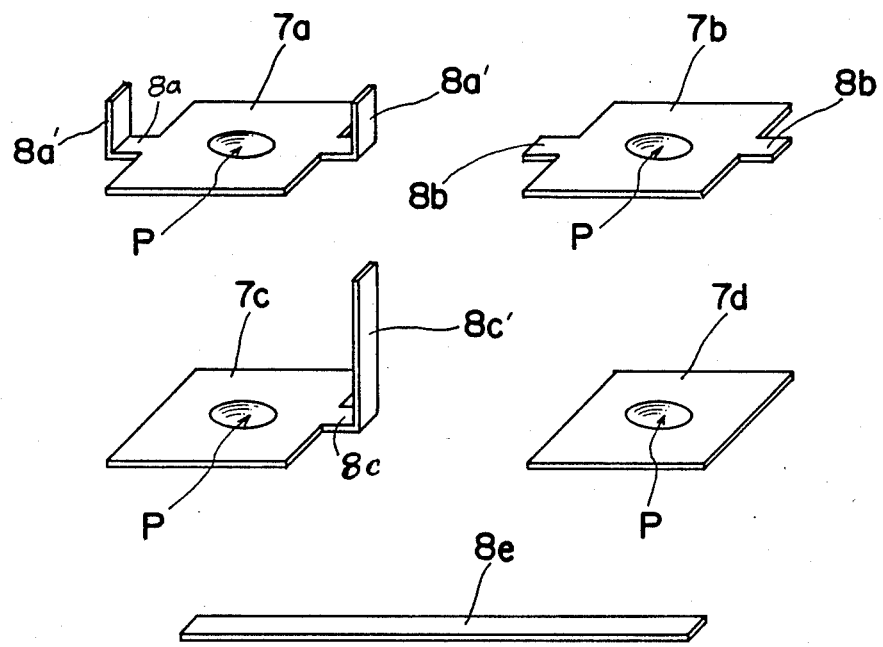

According to the preferred embodiment of the present invention, terminal plates 7a, 7b, 7c and 7d and terminal tip 8e as shown in FIG. 1 are first prepared. These terminal plates and tip are, of course, made of electrically conductive metal material.

The terminal plates 7a to 7d are respectively formed in the shape of a generally regular square having a central projection P at the center thereof which elastically and electrically contacts a piezoelectric device 2 at the central node point thereof allowing a two dimensional vibration thereof.

The terminal plate 7a has a pair of terminal tips 8a and terminal portions 8a' which extend parallel to the direction of one center line thereof and are bent at right angles to the plate 7a and terminal tips 8a.

The terminal plate 7b has a pair of tongue like terminal tips 8b projecting in the direction of the plane thereof.

The terminal plate 7c has one terminal tip 8c which extends in the direction of the plane of the terminal plate and which has a terminal portion 8c' bent at right angles to the plate. The terminal plate 7d has no terminal tip.

The terminal strip 8e is formed as a slender strip each end of which is to extend out of the casing.

Figure 2:
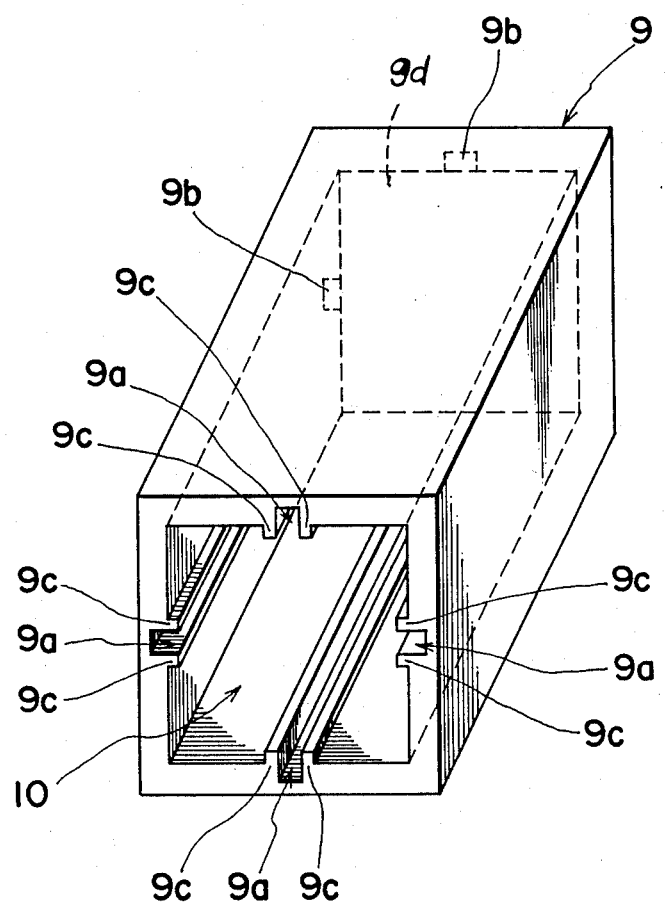

These terminal plates 7a, 7b, 7c and 7d are put into a casing 9, shown in FIG. 2, in a predetermined order together with the piezoelectric devices 2 and, the insulating plates 4.

Figure 3:
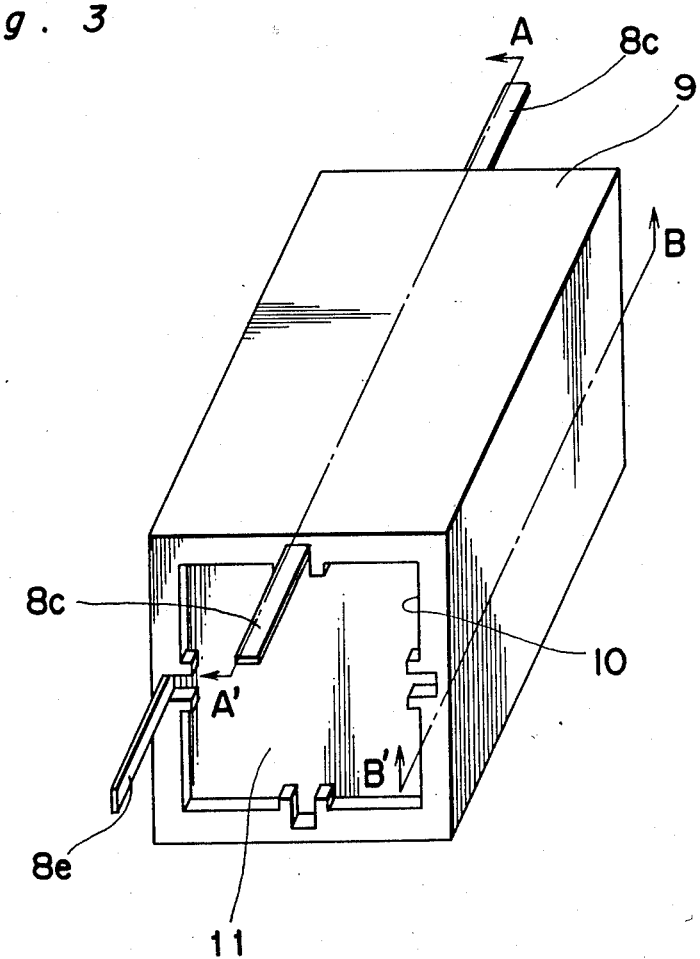

The casing 9 is formed as a rectangular parallelepiped made of an insulating material, one end face of which is open to define a window 10 for putting terminal plates etc. into the casing in the axial direction thereof. On the inner surface of each side wall of the casing 9, there is provided a groove 9a for fitting one or more terminal tips thereinto, and which extends in a direction parallel the longitudinal center line of the side wall from the window to the bottom of the casing. Corresponding to two of the grooves 9a, there are provided two through-holes 9b in the end (bottom) wall of the casing for allowing terminal tip 8c or 8e to be led out as shown in FIG. 3. Two parallel ribs 9c defining the groove 9a therebetween are provided to support piezoelectric devices 2, terminal plates 7a to 7d and insulating plate 4 in the casing 9. These ribs 9c are so designed as to support the piezoelectric devices while maintaining small distances between the devices and the inner wall of the casing, which allows vibrations of the devices.

The window 10 of the casing 9 is sealed up hermetically by a cover plate 11 which is fixed thereto with an appropriate bonding agent or by welding or by fitting under pressure, as shown in FIG. 3.

Figure 4:
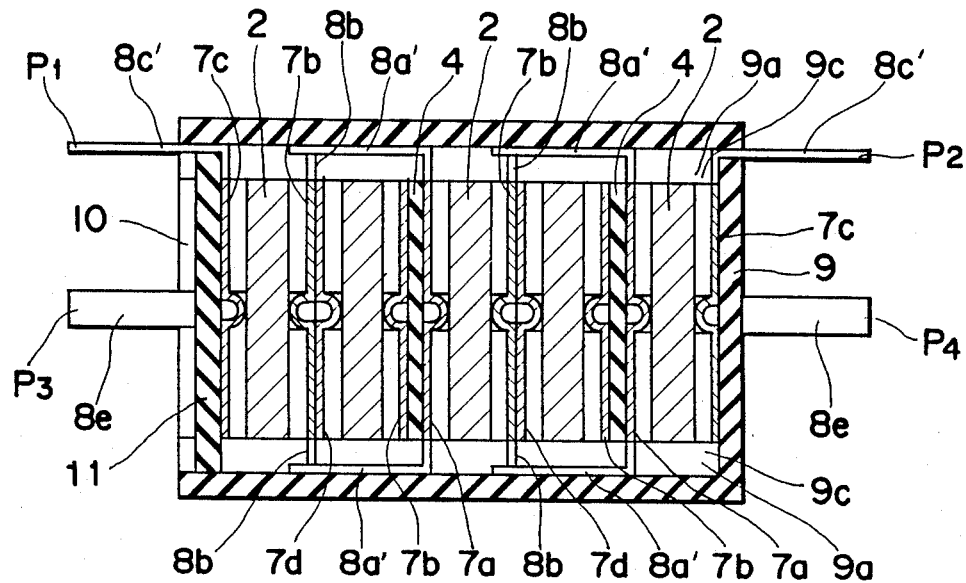
Figure 4:
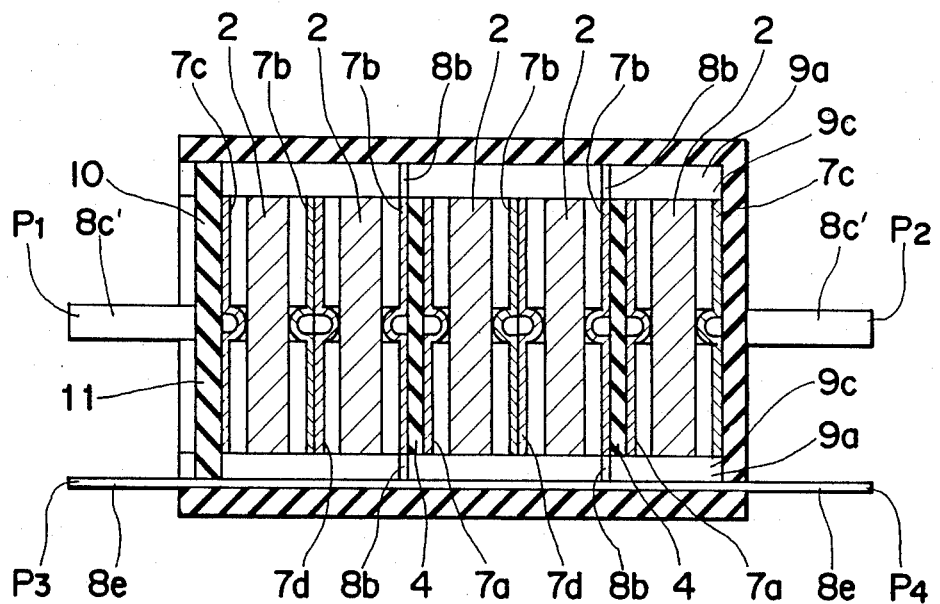

In the embodiment of FIGS. 1-4B, five piezoelectric devices 2, two terminal plates 7a, four terminal plates 7b, two terminal plates 7c, two terminal plates 7d and two insulating plates 4 are inserted in the axial direction of the casing 9 stacked in a predetermined order as shown in FIGS. 4(A) and 4(B). Every piezoelectric device 2 is made of, for instance PZT, and has two electrodes formed on the opposite surfaces. In this embodiment, the piezoelectric device 2 is formed to vibrate in the so-called breathing mode as is defined in U.S. Pat. No. 4,360,754.

As is shown in FIG. 4(A), the terminal tip 8c' of the terminal plate 7c which is positioned between the cover plate 11 and the first piezoelectric device 2 extends out of the casing 9 through the groove 9a. Also the terminal tip 8c of the other terminal plate 7c which is positioned between the end wall 9d of the casing 9 and the fifth piezoelectric device 2 is led out of the casing 9 through the hole 9b in the end wall 9d. The terminal plates 7b and 7d are inserted back to back to each other respectively between the first and second devices and between the third and fourth devices, and, therefore, are electrically connected with each other.

The terminal tip 8a' of the terminal plate 7a is contacted at upper and lower positions to the terminal tip 8b of the terminal plate 7b and, therefore, these two terminal tips 8a' and 8b are electrically connected with each other. Since the terminal tips 8b are formed to contact the upper and lower terminal tips 8a' with a contact force suitable for maintaining the electrical connection between two terminal tips 8a' and 8b, the electrical connection therebetween can be kept in a good state without securing by solder. These terminal tips 8a', 8b and 8c' are formed so as to be fitted into the grooves 9a of the casing 9.

As is clearly shown in FIG. 4(B), one of the terminal tips 8b of the terminal plate 7b is connected to the elongated terminal tip 8e both ends of which extend out of the casing, and is electrically connected thereto. Since the terminal tip 8b is formed as to contact to the terminal tip 8e in the groove 9a with an appropriate contact force, a good electrical contact can be maintained. The contacts between two terminal tips 8b and 8e are kept in the groove 9a of the casing.

Figure 5:
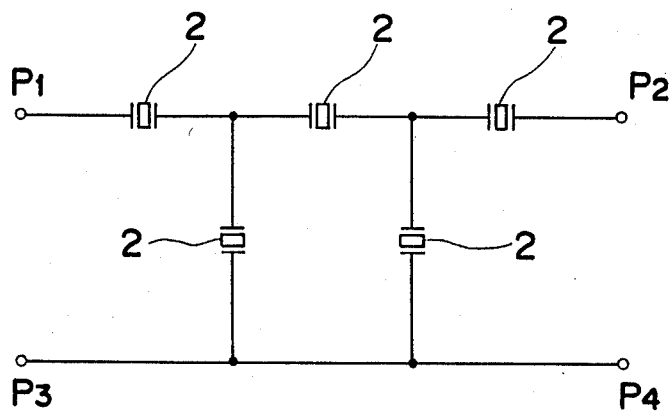

According to the assembly as shown in FIGS. 4(A) and 4(B), there is provided a filter of ladder type, the equivalent circuit of which is shown in FIG. 5. The terminals $P_1$ and $P_2$ of FIG. 5 are constituted by terminal tips 8c of the terminal plates 7c. The terminals $P_3$ and $P_4$ are respectively constituted by each end of the terminal tip 8e.

As is clearly understood from the foregoing, the filter according to the present invention is easily assembled by putting piezoelectric devices, terminal plates, terminal tips and, if necessary, insulating plates into the casing in a predetermined order in the axial direction of the casing. Therefore, electrodes of piezoelectric devices cannot be destroyed, since electrodes are not rubbed with projections of terminal plates upon assembling thereof. Further, according to the present invention, there is no need of welding to maintain electrical connection between terminal tips, since all electrical contacts among terminal tips are simply by physical contacts.

Accordingly, it becomes possible to assemble the filter by the use of a machine designed for automatic assembly thereof.

While there has been described a preferred embodiment, modifications and variations are possible by those skilled in the art without departing from the spirit of the invention. The scope is therefore to be determined solely by the appended claims.

For instance, the casing is not limited to a rectangular parallelepiped and may be a tube or a pipe having, for example, a circular section.

The number of grooves is not limited to four and may be a number other than four. Further, the number of piezoelectric devices is not limited to "five". Also, the vibration mode of the piezoelectric device is not limited to the breathing mode.

Figure 6:
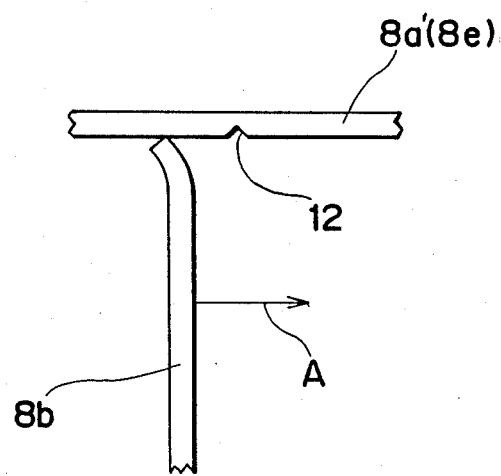
Figure 7:
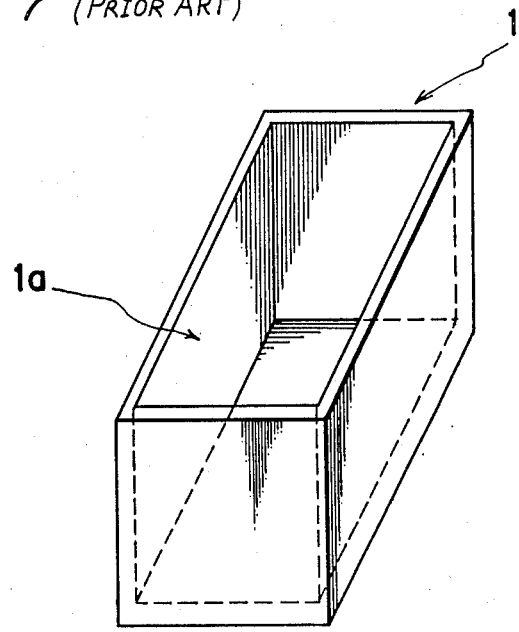
Figure 8:
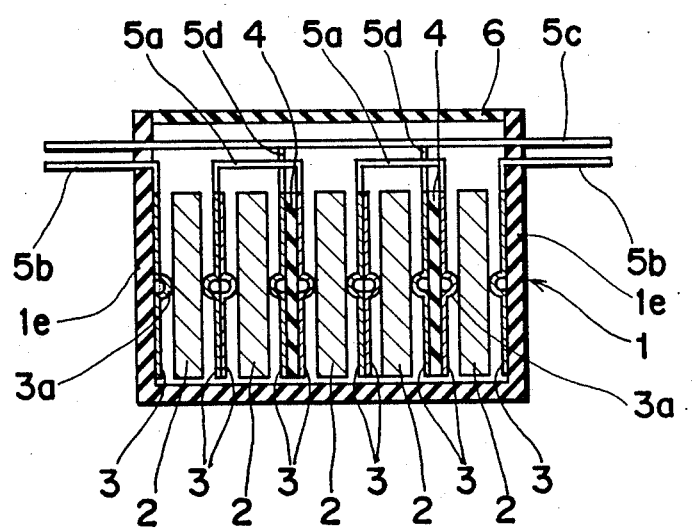

Also, as is shown in FIG. 6, it is effective to provide a notch 12 on the terminal tip 8a' and/or 8e in order to make electrical contact therebetween more tight. Moreover, it is useful to bend the tip end in a direction opposite to the direction A of insertion in order to make insertion thereof easier.

What is claimed is:

1. A filter of the ladder type comprising:
    a casing in the shape of an elongated/hollow body having a longitudinal axis and an inner surface and having an aperture opening out of one axial end face and at least two grooves on the inner surface at at least two different positions around the inner periphery thereof which extend in a direction parallel to the longitudinal axis;

at least one elongated terminal strip in the bottom of one of the grooves and extending along substantially the entire length of the one groove and having at least one end extending out of said casing;

a plurality of piezoelectric devices and a plurality of terminal plates positioned in said casing in a stack extending in the direction of said longitudinal axis and the stack having end terminal plates, the plates in the stack being in a predetermined order for forming with each other a ladder type filter, at least a part of the total number of said terminal plates having terminal tips integral therewith and projecting laterally therefrom in substantially the same plane as said terminal plates, the terminal tips on said part of the total number of said terminal plates extending into said one groove and being in firm electrical contact with said elongated terminal strip, the terminal tips on some of the remainder of said terminal plates extending into a groove other than said one groove and at least some of the terminal tips on said some of the remainder of said terminal plates having longitudinally extending terminal portions thereon extending along said other groove and with which the terminal tips on predetermined ones of said remainder of said terminal plates are in firm electric contact for forming the ladder type filter, and one of the terminal tips on each of the two end terminal plates in said stack having longitudinally extending terminal portions thereon in a groove other than said one groove and extending out of said casing; and a seal means sealing up said aperture.

2. A filter as claimed in claim 1 in which said terminal portions have notches in surfaces thereof which are facing out of said grooves, and the ends of the terminal tips in electric contact therewith are engaged in said notches.

3. A filter as claimed in claim 1 in which each groove has a rib running along each of the opposite edges thereof, which ribs project into the interior of said casing, said ribs engaging said terminal plates from which said terminal tips project for supporting said piezoelectric devices with the edges spaced from the inner surface of said casing for permitting vibrations of said devices.

* * * * *